United States Patent [19]
Nadkarni et al.

[11] Patent Number: 5,481,182
[45] Date of Patent: Jan. 2, 1996

[54] UP/DOWN SPECTRUM SCALING OF SIGNALS

[76] Inventors: Gopalkrishna G. Nadkarni, 2962 Beltline Rd., #1310, Garland, Tex. 75044; Lingappa K. Mestha, 417 Flameleaf La., Cedar Hill, Tex. 75104

[21] Appl. No.: 175,796

[22] Filed: Dec. 30, 1993

[51] Int. Cl.$^6$ .................................................. G01R 23/175
[52] U.S. Cl. .................... 324/76.24; 324/76.38; 364/179; 381/34
[58] Field of Search ............................ 324/76.24, 76.38; 381/29, 34; 364/179

[56] References Cited

U.S. PATENT DOCUMENTS

| | | | |
|---|---|---|---|
| 4,496,974 | 1/1985 | Heitmann | 358/140 |
| 4,843,465 | 6/1989 | Yuasa et al. | 358/133 |
| 5,351,087 | 9/1994 | Christopher et al. | 548/441 |

OTHER PUBLICATIONS

"Nanosecond Data Acquisition System", by McCraven and Epps, Sep. 14, 1961.
Oliver et al, *Electronic Measurements and Instrumentation*, 1971, pp. 398–407.

*Primary Examiner*—Kenneth A. Wieder
*Assistant Examiner*—Glenn W. Brown
*Attorney, Agent, or Firm*—Richards, Medlock & Andrews

[57] ABSTRACT

A system for scaling down the spectrum of a composite signal by a factor in real time to a lower frequency, or for scaling up the spectrum of a composite signal by a factor in real time to a higher frequency is described. The spectrum up conversion and down conversion are achieved using Doppler effect analysis, switches, or sample and hold, analog to digital converters or equivalent sampling devices. As a source signal propagates over a transmission line having multiple delays, samples of the source signal are obtained at each delay and the samples are utilized to reconstruct the original source signal without losing any characteristics. The technique is well adapted for capturing single event signals.

3 Claims, 11 Drawing Sheets

UP/DOWN SPECTRUM SCALING OF SIGNALS

TECHNICAL FIELD OF THE INVENTION

The present invention relates in general to the processing and the analyzation of electrical signals, and more particularly to the spectral up scaling or down scaling of electrical signals to facilitate inspection, analyzation, or processing of the same.

BACKGROUND OF THE INVENTION

When a signal is Fourier Transformed it is expressed in terms of a set of harmonically related phasors which can be graphically represented by the spectrum. Each harmonic of the spectrum has a specific amplitude, phase and frequency. Scaling in frequency of the spectrum corresponds to the inverse scaling in time of the signal. A common illustration is the effect on the frequency content that results when an audio tape is recorded at one speed and played back at a different speed. If the playback speed is higher than the recording speed, then the frequency is scaled up, which corresponds to compression in time and vice versa. In practice this inverse relation between time and frequency may be valuable for several situations in the field of electrical systems. For instance, high speed single shot events are difficult to capture and record numerically using present day analog-to-digital converters. By down scaling all the frequencies of the spectrum, the signal can be stretched in time and then recorded in numerical form using conventional technology.

The technique of spectrum scaling is well known in signal processing and conditioning systems. It is understood that the techniques rely on the scaling of the Fourier Transform relation which is difficult to implement on real time for high speed signals due to the large computational time involved in the Fast Fourier Transform algorithms. In one form, the invention disclosed herein provides a means to achieve real time spectrum scaling, both for down conversion and up conversion, and is easy to implement due to few active electrical components. A Doppler effect is used in the technique together with graphical illustrations and associated mathematical analysis to describe the methods and apparatus of the invention.

SUMMARY OF THE INVENTION

In accordance with the present invention, the disclosed spectral scaling methods and apparatus substantially reduce or eliminate the disadvantages and shortcomings associated with the prior art techniques. In accordance with an important feature of the invention, the source electrical signal is allowed to propagate continuously through a multiple delay medium at a certain velocity, and a second signal is generated by sampling the source signal at specified delay intervals so that when the sampling process is complete, the source electrical signal spectrum is linearly scaled.

In the preferred embodiment of the invention, a source signal of wavelength $\lambda$ and of frequency $f_s$, propagates over a transmission line with a propagation velocity $v_1$, along the medium. It should be understood while that the source signal generator is stationary, the wave propagates over the transmission line. If the detector or signal sampler is allowed to move with a velocity $v_2$, so as to intercept the transmission line, then due to the relative motion between the detector and the source signal either toward or away from each other (depending on the direction of motion of the detector), there will be a change in frequency of the detected signal. If the detector is moving in the same direction as the source signal but at a lower speed, then the detected signal whose frequency is equal to the rate at which the detector intercepts the source wave, is scaled down, whereas if the detector is moving in the direction opposite the source wave, then the frequency will be higher. This motion-related frequency is known as the 'Doppler-effect'. If $f_0$ is the frequency of the detected signal, then the following equation applies:

$$f_o = \frac{v_1 - v_2}{v_1} f_s \quad (1)$$

when the detector moves away from the source and in the direction parallel to the source signal propagation. Also, $$f_o = \frac{v_1 + v_2}{v_1} f_s \quad (2)$$

applies when the detector moves towards the source and in the direction opposite to the source signal propagation.

In the preferred embodiment of the invention, a transmission line having plural delay units is tapped at equal spacings and the detector and its motion comprise a series of switches operated in a sequence. The process of turning the switches on and off sequentially at regular intervals generates samples that constitute the second signal. According to an important aspect of the invention, when the second signal is reconstituted all the frequency components of the source spectrum are scaled down or up depending on the relative direction of the signal propagation.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, elements or functions throughout the views, and in which.

DETAILED DESCRIPTION OF THE INVENTION

Figure 1:
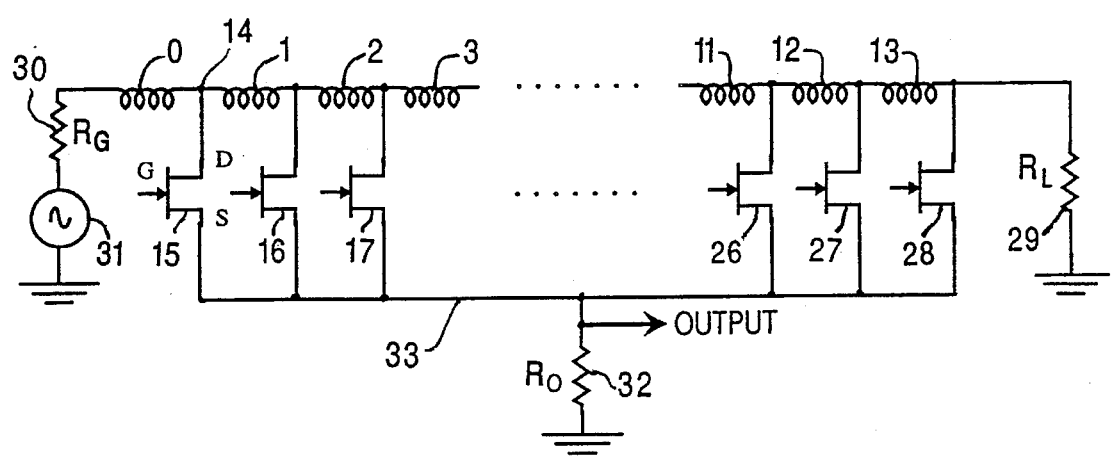
FIG. 1 illustrates a spectrum scaling system used for the spectral down scaling and up scaling of a source sine wave signal, wherein the system is shown with circuit components used for (i) down scaling an exemplary 1.666 MHz periodic source sine wave to a resulting 1 MHz periodic sine wave, and (ii) up scaling an exemplary 1.0286 MHz periodic source sine wave to a 3.6 MHz periodic sine wave.

FIG. 1 illustrates an application in which the invention can be advantageously practiced. The principles and concepts of the invention can be utilized to capture single event signals or happenings, for example, a high speed, single shot electrical signal cannot generally be captured and displayed on an oscilloscope. However, when such a signal is processed according to the techniques of the invention, such a signal can be captured using lower speed circuits, and thereafter regenerated or reconstituted and displayed without loosing any characteristics or information concerning the original signal. Those skilled in the art may find that the principles and concepts of the invention can be applied to many other applications, including electrical fields. In the spectral scaling system shown in FIG. 1, a tapped transmission line is represented by delay elements numbered 0 to 13. In this system an electrical source 31 is utilized to produce a periodic sine wave. For convenience, a single period sine wave is considered to describe the working principles according to the invention. The system shown in FIG. 1 can be advantageously used with any kind of waveforms, such as periodic or burst composite signals, sine waves, ramps, pulses, etc. The signal source 31 is connected to a generator resistor 30. This resistor 30 is connected to the transmission line delay element 0. According to the preferred form of the invention, the delay elements can constitute distributed inductance/capacitance of a transmission line, or discrete components, or switched capacitor elements. The last delay element 13 is connected to circuit ground through a terminating load resistor 29. Each tapped point of the transmission line, indicated by junction 14 is connected to the drain terminal of a Field Effect Transistor (FET), such as shown by reference numerals 15 to 28. The FETs 15 to 28 are employed as switches and can be replaced by other types of transistors or mechanical contacts, analog to digital converters, sample and hold electronic circuits or any other equivalent devices. While not shown, the system includes logic circuits to generate the timing signals for switching the transistors on and off. Logic circuits adapted for generating timing signals can include a shift register having plural outputs, each connected to clock the gate terminals of the FET switches 15–28. A logic one can be shifted through the stages of the shift register to turn on each transistor for a specified period of time. Other memory and counter circuits can be devised by those skilled in the art to sequentially control the switches to sample the voltage at each junction of the delay elements. The source terminals of the switches 15 through 28 are connected to a common point 33 which is connected to circuit ground through an output resistor 32. Here, the output resistor 32 represents the load circuit, where the desired spectrally scaled signal appears after the transformation. While not shown, preamplifier circuit can be utilized at the source terminal and at intermediate stages between the delays and FETs. The preamplifiers may be required to increase the signal power, especially on long transmission lines.

Figure 2A:
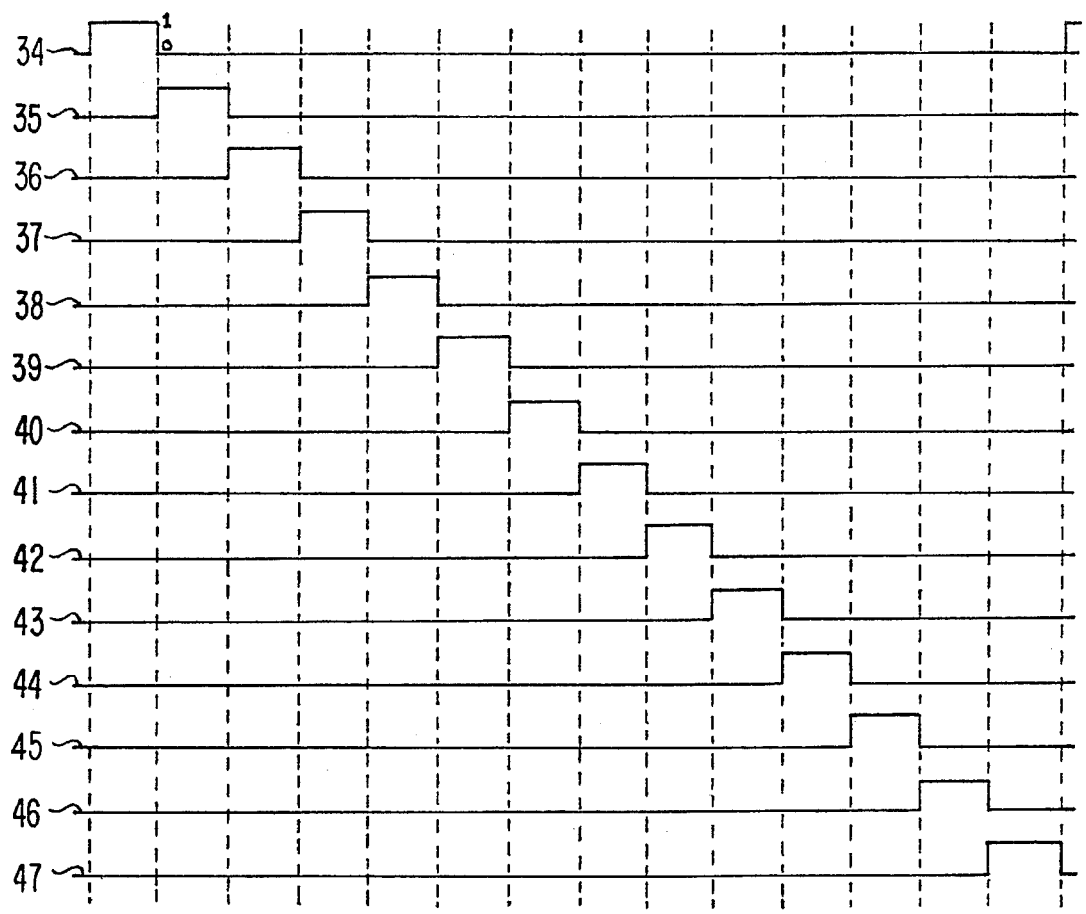
FIG. 2(a) graphically depicts a possible timing diagram for turning the switches on/ off for the spectrum down scaling operation of the system of FIG. 1.

In the preferred embodiment shown in FIG. 1 the periodic source sine wave of 1.666 MHz is spectrally scaled to periodic sine wave of frequency 1 MHz at the output resistor 32. Delay units 0 to 13 are set or chosen equal to 28.6 nanoseconds each. The FET switches 15 through 28 are turned on for a short period of 71.4 nanoseconds sequentially one after the other with only a single FET on at any given time. The switching process used in the preferred embodiment starts with FET 15 soon after the source wave arrives at junction 14 between the drain terminal of FET 15 and the input end of the delay unit 1. After FET 15 is turned off, FET 16 is switched on, and then FET 17 etc., up to FET 28 to process one complete period of the source signal. A typical timing diagram associated with the switching process is shown in FIG. 2(a). Timing signal 34 drives FET 15, in which a logic '0' represents the off condition of the switch and a logic '1' represents the on condition of the switch. Similarly, the timing signal 35 is used to turn on FET 16, signal 36 is used to turn on FET 17 and so on with signal 47 turning on FET 28. For simplicity the obvious nonlinearities occurring at the time the FET 15 is turned off and FET 16 is turned on are ignored. Clearly, in the timing diagram shown in FIG. 2(a) a single FET is on at any given time.

Figure 2B:
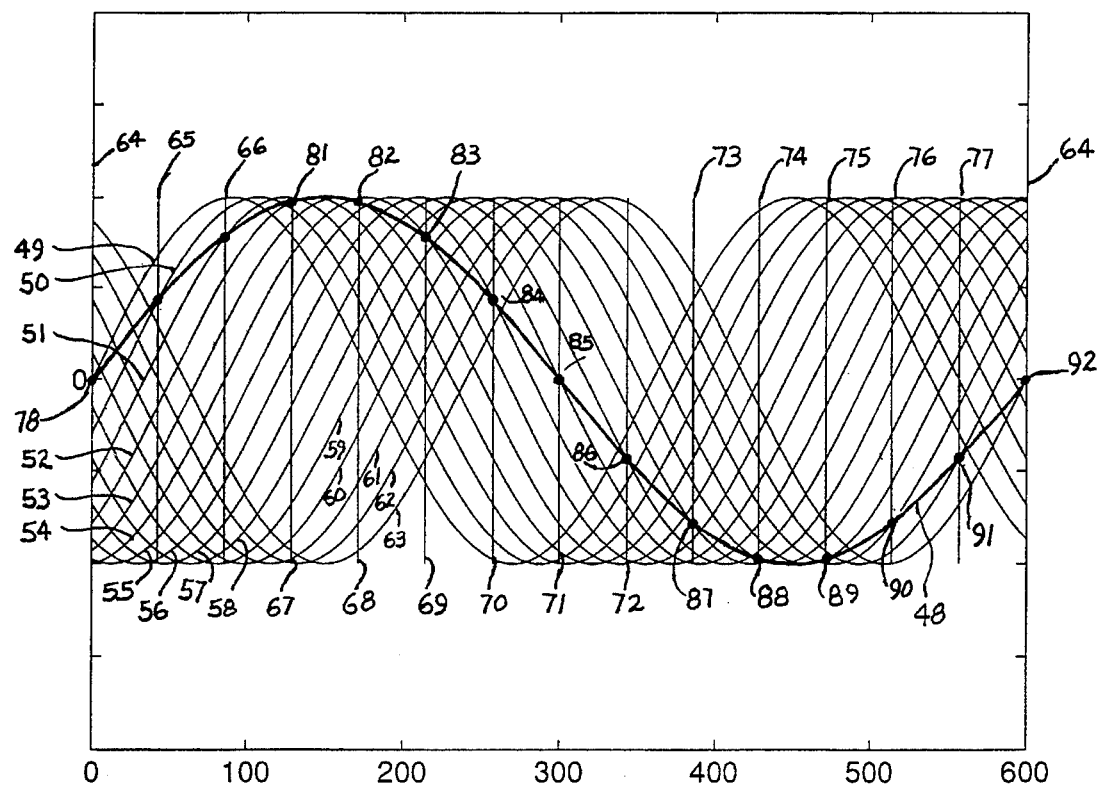
FIG. 2(b) graphically depicts step by step how the periodic source sine wave with a frequency of 1.666 MHz is scaled down to a periodic sine wave with a frequency of 1 MHz.

Source sine waves 49 through 63 are shown in FIG. 2(b), where the horizontal axis is shown in degrees. Sine waves 50 through 62 are shown each with the phase thereof shifted in time corresponding to the delay values of each individual delay units 1 through 13. In addition, the sine wave 49 is also phase shifted as a result of delay through unit 0. For convenience, on the x-axis the phase angles of the source sine wave is shown and the time starts as soon as the source sine wave leaves the delay unit 0. Due to fixed delays of 28.6 nanoseconds in each delay unit 0 through 13, the source signal is sequentially phase shifted equally throughout the transmission line. The cumulative phase shift represents the propagation of the wave from the source 31 to the load 29 through the transmission line. As noted above, in the preferred embodiment, the FETs 15 through 28 are switched sequentially with an on-time duration of 71.4 nanosecond. These intervals are represented in FIG. 2(b) by the vertical lines 64 through 77. By sequentially switching the FETs, a virtual moving detector is utilized to sample the wave propagating over the transmission line. The speed with which the detector moves over the transmission line is controlled by the switching circuits that control the FETs. Line 64 corresponds to the time when FET 15 turns on and line 65 corresponds to the time when FET 16 turns on. At the same time FET 15 is turned off, FET 16 turns on as shown by the timing signals 34 and 35 respectively. During the interval between lines 64 and 65 a point 78 on the source sine wave 49 (this point is the intersection of line 64 with the sine wave 49) is moved to a new point 79 on the phase shifted source sine wave 50 (this point is the intersection of line 65 with the source sine wave 50). Since FET 15 is held on during the whole interval of 71.4 nanoseconds, a portion of the moving source sine wave 49 is detected and then registered across the output resistor 32. As will be seen later, this portion of the sine wave corresponds to the first of 14 segments of the spectrally down scaled signal 48. Referring again to FIG. 2(b), in the interval between lines 65 and 66, when FET 16 is turned on, point 79 on the propagating source sine wave 50 is moved to point 80 on the source sine wave 51 (this point is the intersection of line 66 with the sine wave 51). In this second time interval between lines 66 and 67 the signal registered across the output resistor 32 corresponds to the second segment of the 1 MHz output signal 48. This process continues until the last FET 28 is switched on during the time interval between the lines 77 and 64. When all the fourteen FETs 15 through 28 are switched on and off sequentially one full period of 1 MHz signal appears across the output resistor 32. The second cycle of the compressed signal begins when another similar switching sequence, as described above, starts with FET 15 and continues through to FET 28. Sine wave 63 is shown to represent the beginning of the next source signal travelling over the transmission line after passing through delay unit 0.

Figure 3:
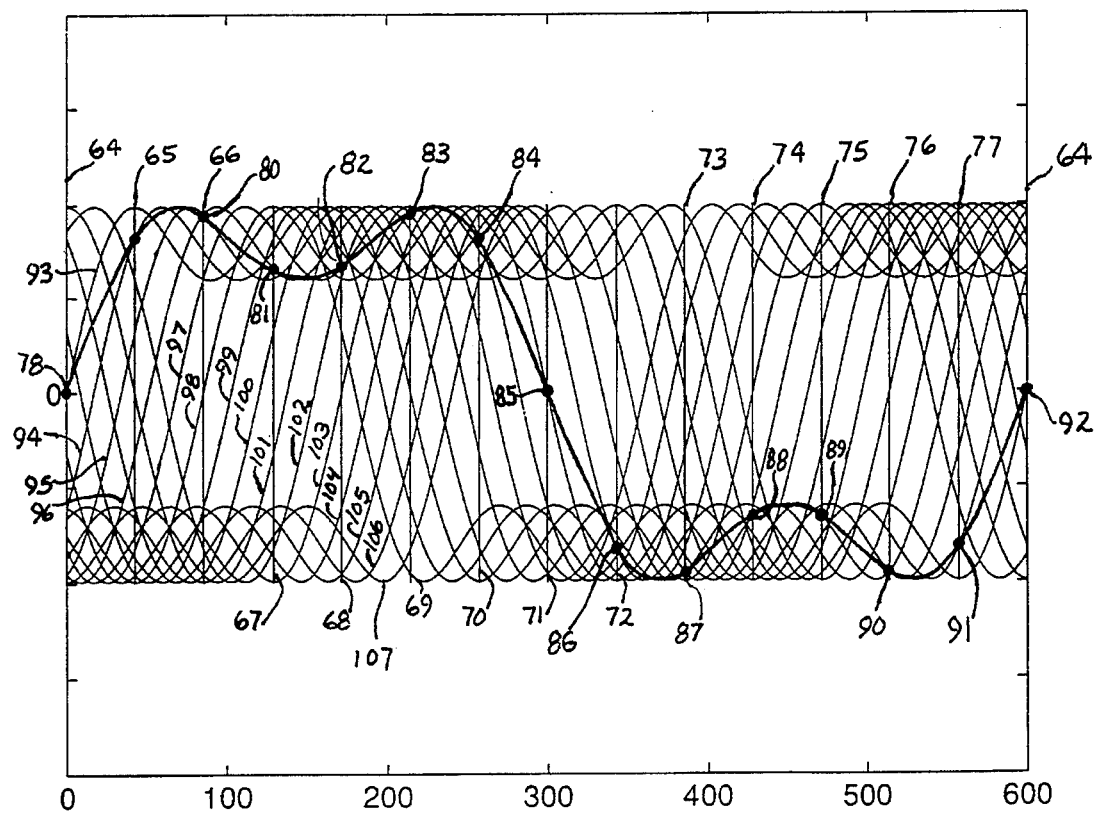
FIG. 3 graphically depicts step by step how each harmonic of the composite periodic source signal with a spectrum containing a fundamental and a third harmonic frequency is scaled down linearly.

As was described above, the source signal can be a composite signal with harmonics. In FIG. 3 one such signal is considered to be generated by the source which contains a fundamental at 1.6666 MHz and the third harmonic of the fundamental sine wave at 5 MHz. Composite signal 93 appears at the input to delay unit 1 after passing through delay unit 0, and then undergoes a phase shift as shown by signals 94, 95 . . . , 106 as it passes through the series of delay units 1 to 13. Once the switching process continues from FETs 15 to 28, the output signal appears stretched in time, as shown by the heavy line in FIG. 3, with the fundamental at 1 MHz and the third harmonic at 3 MHz. Thus, both frequency components are scaled down linearly by a factor equal to 1.666.

Usually in a composite signal there is more than one sine wave with higher order frequencies with a given amplitude and phase. Therefore, it is worth understanding whether the spectrum scaling system described in FIG. 1 can down scale all the frequency components of the source signal by the same scaling factor. To show that the system described herein can provide the spectral scaling of the source signal, a simple mathematical proof is described below.

At each sample point k, by using sampled data theory, the composite source signal in terms of Fourier series is given by:

$$u_k^s = \sum_{j=0}^{N-1} \left[ a_j \cos \frac{2\pi jkT}{NT} + b_j \sin \frac{2\pi jkT}{NT} \right] \quad (3)$$

where NT corresponds to the finite duration after which the signal repeats, N defines the total number of samples and T the sampling period, and j is the harmonic number. Also, $a_j$ and $b_j$ are coefficients of cosine and sine terms in the Fourier series of the jth harmonic. By taking Fourier transform of the composite source signal, it can be transformed to frequency domain as follows:

$$F_n = \frac{1}{N} \sum_{k=0}^{N-1} u_k^s e^{-\left(i\frac{2\pi nk}{N}\right)} \quad (4)$$

where $i=\sqrt{-1}$, the imaginary quantity, and n=the harmonic number. By substituting equation 3 in equation 4, and simplifying the algebra, the source signal spectrum can be illustrated by:

$$F_n = \frac{1}{2}[a_n - ib_n] \quad (5)$$

Equation 5 corresponds to the relative amplitude and phase weighting of the source signal spectrum in which $a_n$ and $b_n$ represent the weighting of cosine and sine terms in the Fourier series of the nth harmonic. When the source spectrum is down scaled, the output signal appearing across the output resistor 32 is stretched in time. Using equation 1, the scaling factor $\epsilon_d$, between the source and the load frequency for the stretched signal can be written as:

$$\epsilon_d = 1 - \frac{v_2}{v_1} \quad (6)$$

For the output signal appearing across the output resistor 32, the sample period is equal to the on time of each FET 15 to 28. The duration of the on-time for each FET can be progressively made different in a linear or nonlinear manner in the switching sequence of the FETs, where a time varying scaling factor is desired. Although many such variances in the on-time of each FET is possible, the description is confined to equal switching periods.

The on time of the FETs 15 to 28 and the time delay of each delay units 0 to 13 are however, related by the following equation:

$$\tau = \frac{v_2}{v_1} T \quad (7)$$

where $\tau$=the time delay of each delay unit in the transmission line, and T=on time of each FET. After the source signal is spectrally down scaled using the system shown in FIG. 1, it can be represented in terms of the Fourier series as follows:

$$u_k^l = \sum_{j=0}^{N-1} \left[ a_j \cos \frac{2\pi jk(T-\tau)}{NT} + b_j \sin \frac{2\pi jk(T-\tau)}{NT} \right] \quad (8)$$

Substituting equations 6 and 7 in equation 8, and by taking the Fourier transform of the resulting equation, the output signal is transformed to frequency domain. After simplifying the algebra, the line spectrum of the output signal is obtained and is equal to:

$$F_n = \frac{1}{2}[a_{n/\epsilon_d} - ib_{n/\epsilon_d}] \quad (9)$$

When equation 9 is compared to the source signal spectrum shown in equation 5, it is clear that each frequency component of the output signal spectrum is linearly scaled. For example, when $\epsilon_d$=0.5 and n=1, equation 9 demonstrates that $F_1=\frac{1}{2}[a_2-ib_2]$. This means the magnitude and phase values of the second harmonic of the source signal is actually equal to the magnitude and phase values of the first harmonic of the output signal due to the down scaling of the spectrum by a factor $1/\epsilon_d$=2.

Figure 4A:
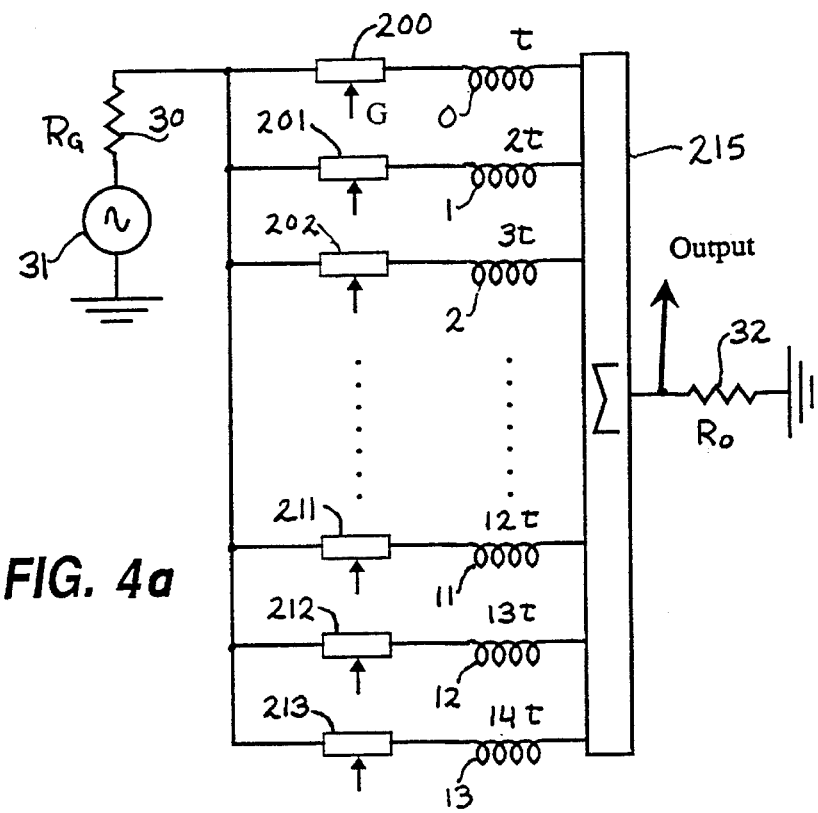
FIG. 4(a) illustrates another implementation of the spectrum scaling system of the invention using longer delay units.

FIG. 4(a) illustrates another form of the implementation of the spectrum scaling system according to the invention. According to this technique, the delay units 0 through 13 are not set to equal delays. Instead, the delay values are multiples of the lowest delay of $\tau$ seconds, as shown with each delay unit 0 through 13. In the preferred embodiment of the system shown in FIG. 4(a), each parallel delay unit is terminated in the combiner circuit 215. This combiner takes first input and directs it to the output. The second input is then taken by the combiner and directed to the output and so on. Those skilled in the art can readily devise combining circuits to accomplish this purpose. This is helpful in order to address the impedance discontinuities when the switching process is in progress. In this implementation, Single Pole Double Throw (SPDT) switches are used as a matter of engineering choice with the timing control signal connected to the terminal G. The SPDT switches 200 to 213 in the diagram are shown connected to delay units 0 to 13 respectively. When transmission lines are used as delay units, the SPDT switches connect grounded terminating resistors (not shown) to the respective delay units, when the control signals are in the off condition. When the control signals are in the on condition, the source signal is connected through the SPDT switch to the delay units. In this implementation, the source signal processed by delay unit 13 arrives at the output resistor 32 when the switch 213 is on and after being delayed by an amount fourteen times that of delay unit 0. When switches 200 through 213 in FIG. 4(a) are switched on/off sequentially according to the timing signals 34 through 47 shown in FIG. 2(a), and if the source is a sine wave, then the time stretched signal 48 in FIG. 2(b) appears across the output resistor 32. Also, for a composite source signal, the spectrum of the output wave will be linearly scaled as described above.

Figure 4B:
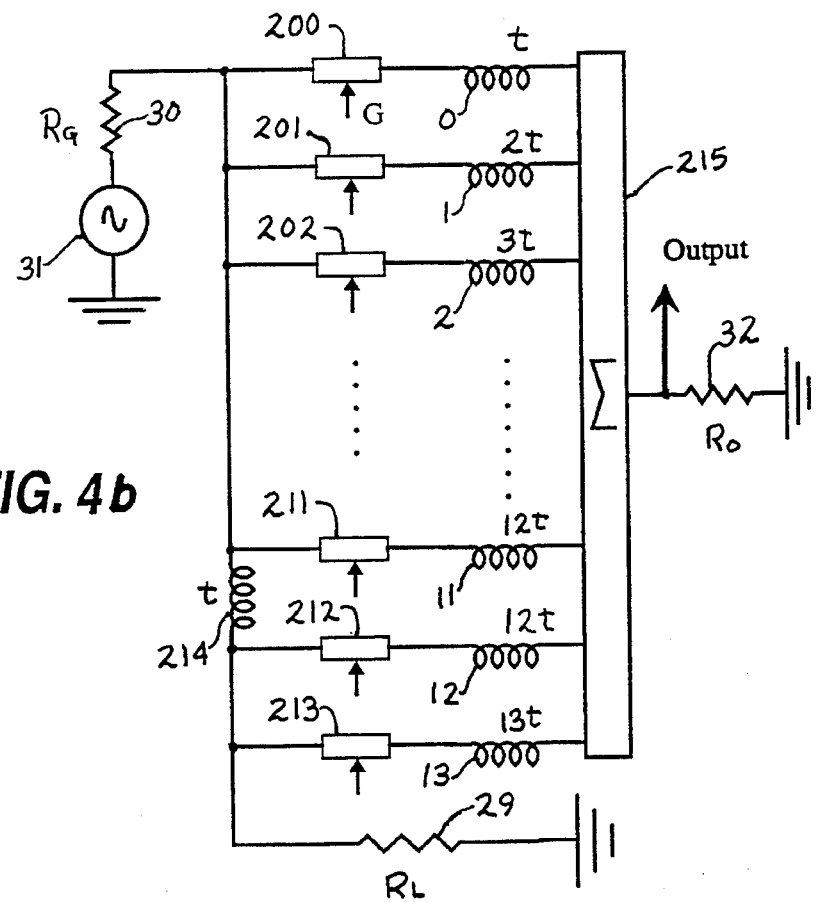
FIG. 4(b) illustrates a modified form of FIG. 4(a) with common delay units in between longer delay units.

A small modification to FIG. 4(a) is shown in FIG. 4(b) where an optional delay unit 214 with a delay of $\tau$ seconds is inserted in the node separating the parallel delays. Due to the presence of the delay unit 214 parallel delay units 12 and 13 are set equal to $12\tau$ and $13\tau$ respectively. Other similar delay units 214 can be utilized in separating yet other parallel delays. Thus, this architecture has similarities corresponding to the architectures of FIG. 1 and FIG. 4(a). In all these configurations of the spectrum scaling system, the timing signals for the switching process remains essentially unaltered.

Figure 5:
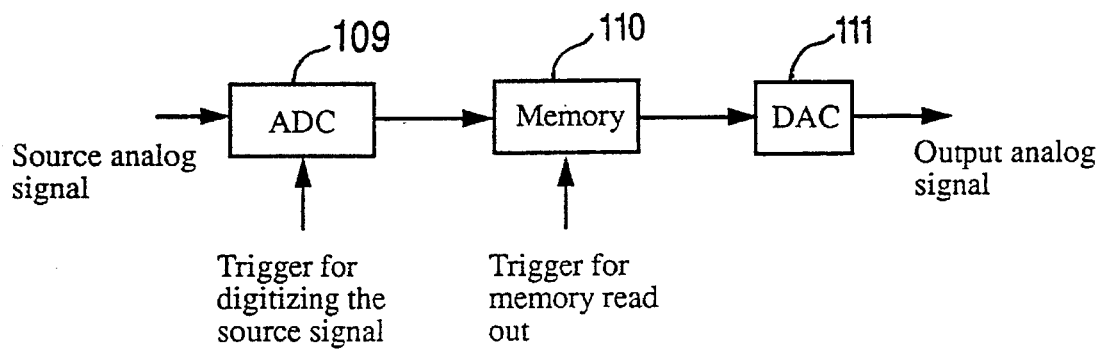
FIG. 5 illustrates a digital implementation of the spectrum scaling system.

FIG. 5 illustrates a digital implementation of the spectral down scaling principle discussed above. The analog-to-digital converter (ADC) 109, or an equivalent device, samples the source analog signal 49 of FIG. 6 at preset intervals shown by the timing signal 112. The data from the ADC 109 is captured on the fly at each trigger interval and stored in a dual port digital memory 110. Meanwhile, the data from the memory 110 is read out as preset by the trigger signal 113 to a digital-to-analog converter (DAC) 111, or an equivalent device, and converted to an analog signal at a slower rate. Presetting of the time intervals for sampling the ADC 109 and for reading out the data stored in the memory 110 is described below by referring to FIG. 6, in which, FIG. 2(b) is reproduced. For understanding the timing signals used in FIG. 5, it is recalled that the spectral down scaling of the source sine wave of 1.666 MHz to 1 MHz, using the system shown in FIG. 1, the delay units 0 through 13 were selected at $\tau$=28.6 nanoseconds and an equal switching time interval of T=71.4 nanoseconds was used to switch the FETs 15 to 28. However, the time intervals $\tau$ and T are subdivided into n and m subintervals, $\mu$ seconds, respectively, such that the relationship shown below is valid.

$$\frac{\tau}{T} = \frac{n}{m} \qquad (10)$$

Figure 6:
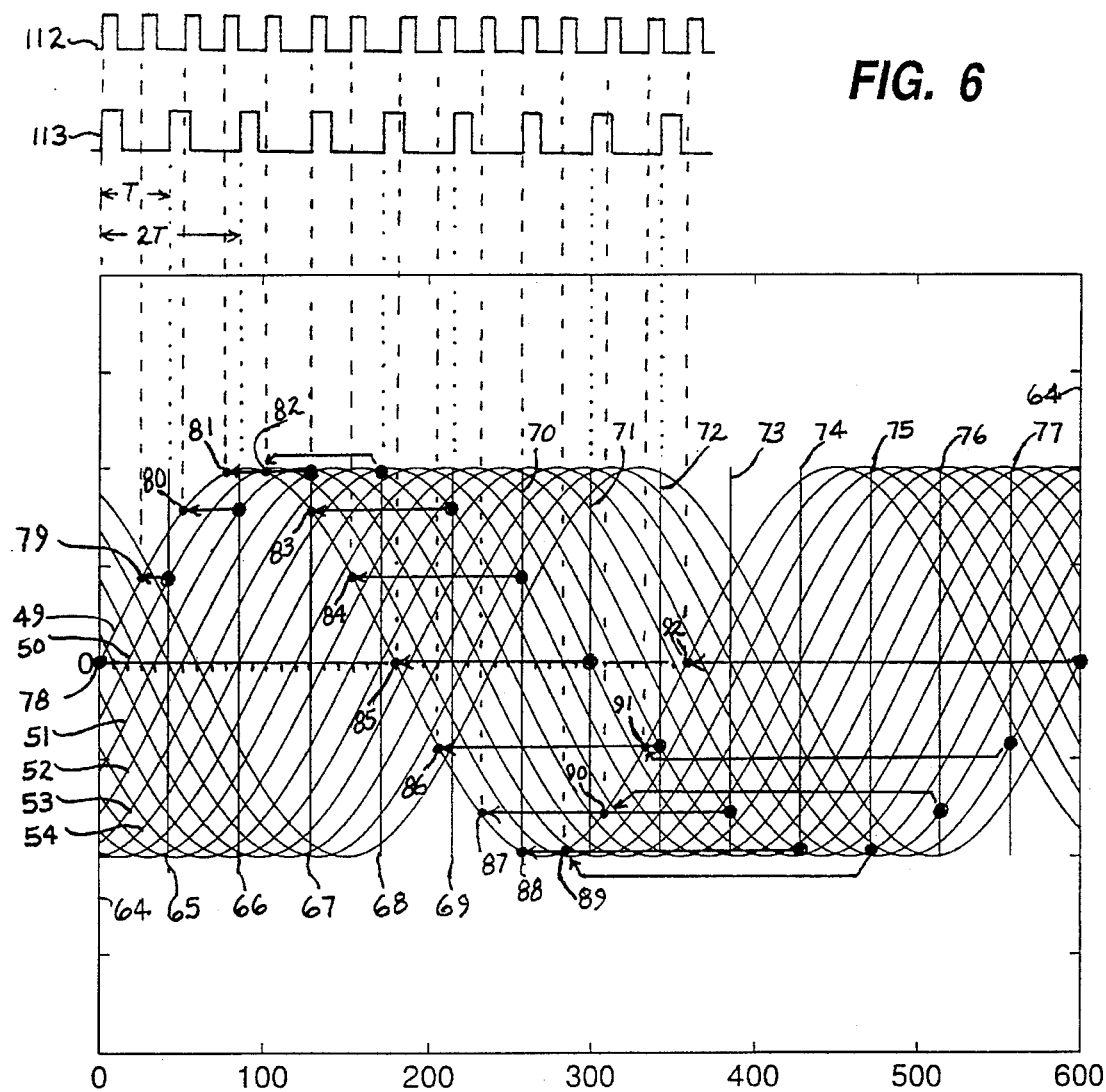
FIG. 6 graphically illustrates how to calculate the time intervals for sampling the source signal when the digital implementation is used as a spectral down scaling system.

For $\tau$=28.6 nanoseconds and T=71.4 nanoseconds, n=2 and m=5, the subinterval is equal to 14.28 nanoseconds. These subintervals are shown in FIG. 6 on the central x-axis with tick marks. Clearly, the source wave 50 is shifted in phase by two subintervals (since n=2). Similarly, the turn on time of FET 15, which is the interval between lines 64 and 65 is divided into five equal subintervals. The intersection of line 65 with the source sine wave 50 corresponds to the point 79 on the time stretched output signal. By drawing a horizontal line from right to left, point 79 is projected on the source sine wave 49 at the intersection point. This point appears at the third subinterval from the origin, which is equal to (5-2) subintervals. Similarly when point 80 on the output signal is projected over the source sine wave 49, the sample appears at the 6th subinterval, which is equal to 2(5-2) subintervals. The process of identifying the points to define the resultant signal across the load resistor 32 continues. These points are summarized in Table 1. The

TABLE 1

| Points on the output signal | 78 | 79 | 80 | 81 | ... | 92 |
|---|---|---|---|---|---|---|
| Time samples on the source signal for FIG. 6 | 0 | (5 − 2)μ | 2 (5 − 2)μ | 3 (5 − 2)μ | ... | 13 (5 − 2)μ |
| Time samples on the source signal (general case) | 0 | (m − n)μ | 2 (m − n)μ | 3 (m − n)μ | ... | 13 (m − n)μ | third row of the Table 1 shows the time intervals over which each designated point on the output signal corresponds to the samples of the source signal. Thus, the ADC trigger signals 112 are set using the intervals shown in the third row of the table. The data sampled at (m−n)μ intervals is read from the memory 110 and coupled to DAC 111 at T seconds. Similarly the data sampled at 2(m−n)μ intervals is read at 2T seconds to DAC 111, and so on, until the point of memory overflow. The whole process can be repeated over and over again. With the algorithm shown in Table 1 for the time interval selection of the ADC trigger, all the frequency components of the composite source signal can be spectrally scaled down by the factor $\epsilon_d$, as described by equation 6.

Figure 7A:
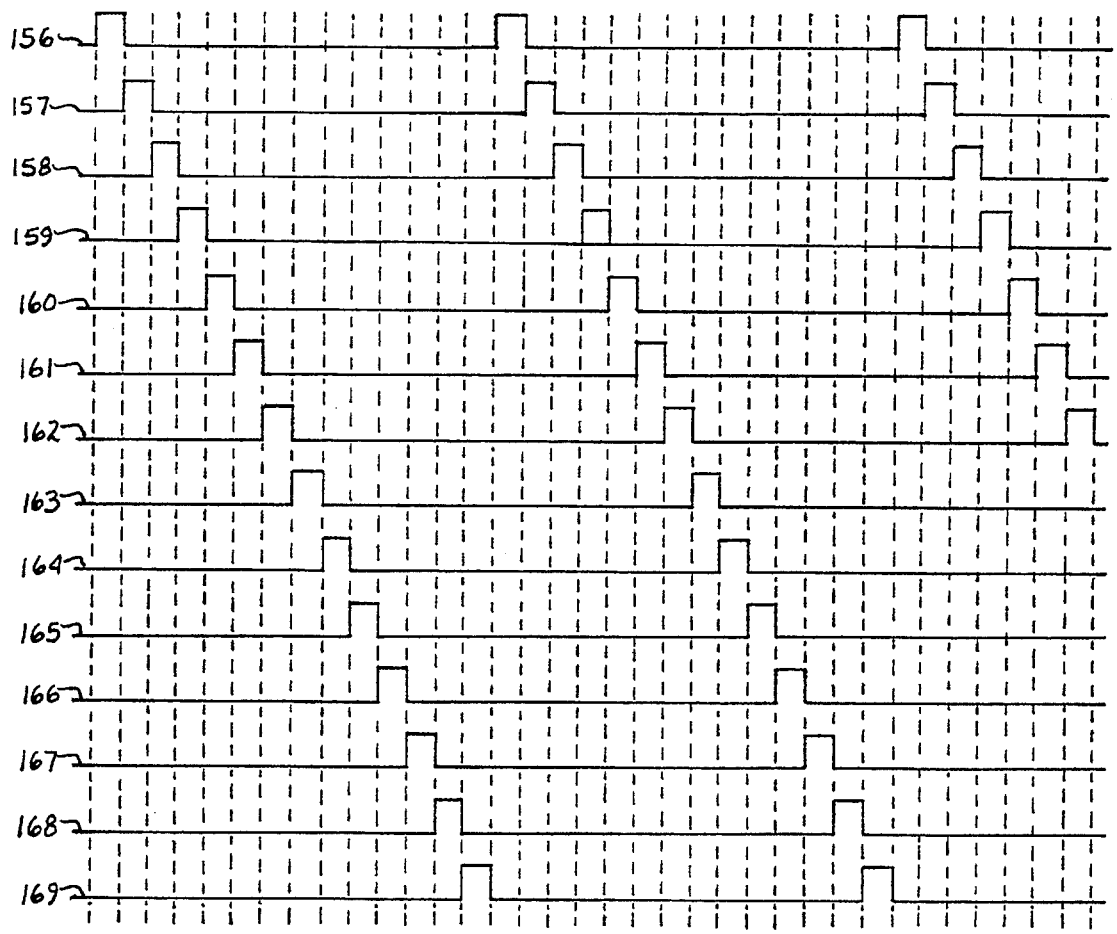
FIG. 7(a) graphically depicts a possible timing diagram for turning the switches on/ off for the spectrum up scaling operation of the system shown in FIG. 1.

As described above, when the detector moves towards the source and in the direction opposite to the source wave propagation, the spectrum of the detected signal will be up scaled, relative to the source wave spectrum. This is accomplished by reversing the direction of the switching process of FETs 15 through 28. In FIG. 7(a) the detailed switching process is shown for a source sine wave of 1.0286 MHz to up scale the frequency to 3.6 MHz, by a factor $\epsilon_u$=3.5, where $\epsilon_u$ is a spectrum up scaling factor given by:

$$\epsilon_u = 1 + \frac{v_2}{v_1} \qquad (11)$$

Figure 7B:
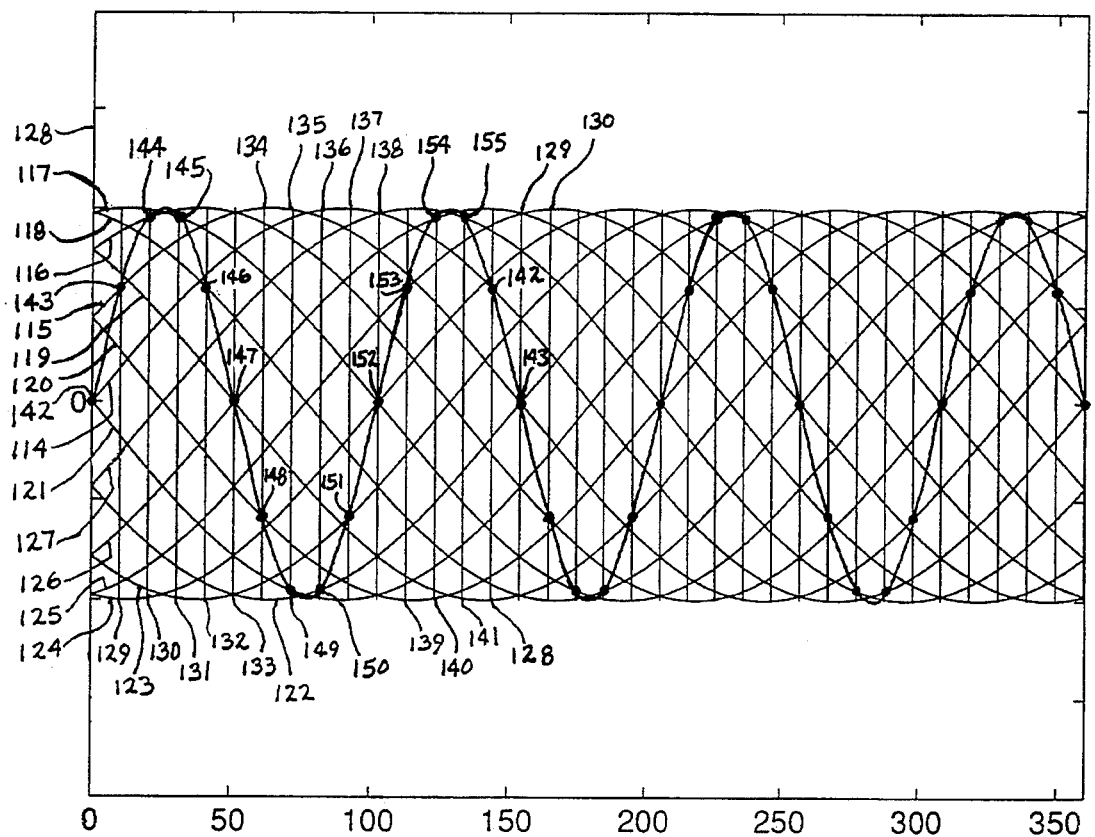
FIG. 7(b) graphically depicts step by step how a periodic source sine wave with a frequency of 1.0286 MHz is scaled up to a periodic sine wave with a frequency of 3.6 MHz.

In this example, all the FETs 15 through 28 are sequentially left on for equal durations of 7.94 nanoseconds. The switching process starts with FET 28 and ends with FET 15. The timing signals 156 to 169 are used to switch FET 28 to FET 15, respectively. For the transmission line, equal delay units 0 through 13 are selected with a delay of 19.84 nanoseconds. The switching process starts as soon as the source sine wave 114 in FIG. 7(b) first appears at the intersection point between the last switch FET 28 and the output end of the delay unit 13. In FIG. 7(b) the source sine waves 114 to 127 are shown to represent the signals at the end of delay units 13, 12, 11, and so on up to 0 respectively. The resultant, or output signal, is shown as a heavy line. The last switch FET 28 is turned on first for the first interval shown between lines 128 and 129, using timing signal 156. With this process, a sample point 142 on the output signal (this point is the intersection of line 128 with the source sine wave 114)

moves to point 143 on the output signal (this point is the intersection of line 129 with the source sine wave 115). After this the switch, FET 27, is turned on for the interval shown between lines 129 and 130. After the second time interval has elapsed, the point 143 moves to point 144 on the load signal (this point is the intersection of line 130 with the source sine wave 116). In this way, if the switching process is continued until after the switch FET 19 is turned on during the interval shown between lines 137 and 138, the output signal is fully reconstructed for one full period. This corresponds to 3.6 MHz in frequency for the source wave of 1.0286 MHz. If the process is further continued until after the switch FET 15 is turned on during the interval shown between lines 140 and 141, part of the second cycle will be completed (up to point 155 on the load signal). To maintain continuity in the output signal, the switching process has to start again from FET 28, then FET 27 and so on with the timing signals shown in FIG. 7(a). In this way the complete 3.6 MHz signal is reconstructed.

Figure 8:
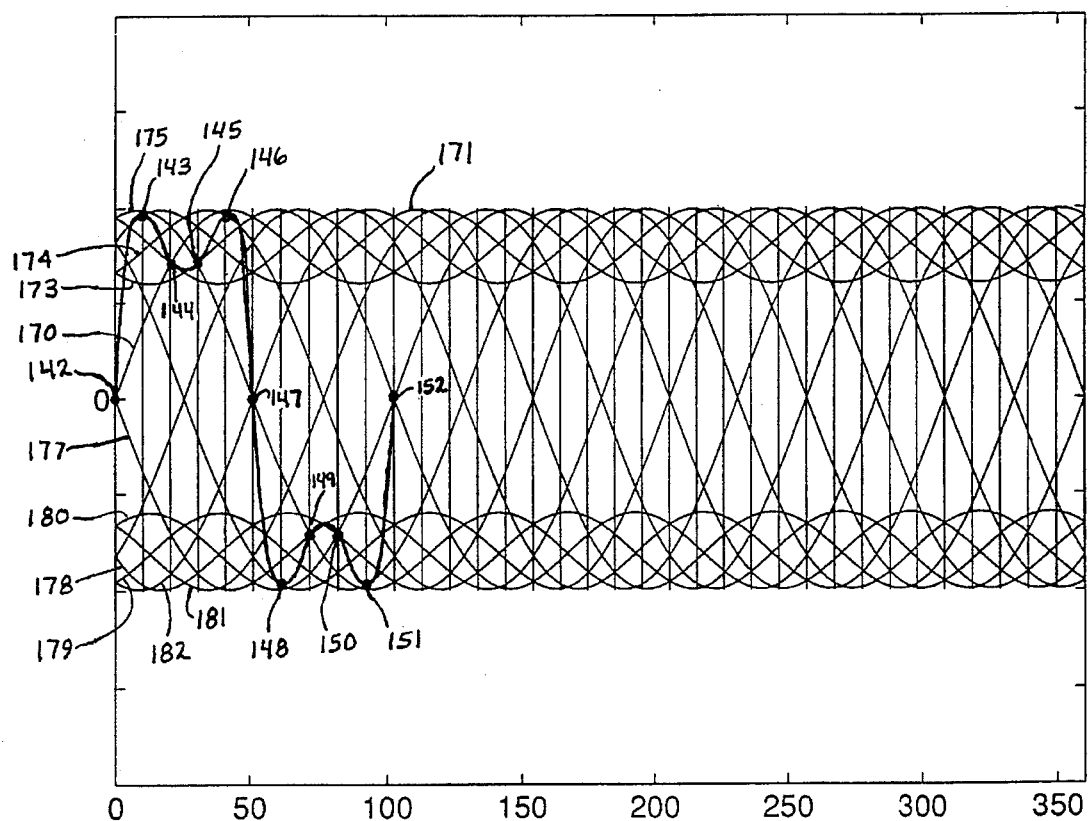
FIG. 8 graphically depicts step by step how each harmonic frequency of the composite periodic source signal with a spectrum containing a fundamental and a third harmonic frequency is scaled up linearly.

FIG. 8 graphically illustrates the spectral up scaling of the composite source signal when the source wave is generated using first and the third harmonic contents. Signals 170, 171, 172, . . . 183 represent the waves at the end of each delay units 13, 12, 11, . . . 0 respectively. Clearly, the output signal across the resistor 32 appears to have been scaled linearly. While not mathematically shown, the proof of the spectral up scaling with all the harmonics is evident.

Figure 9:
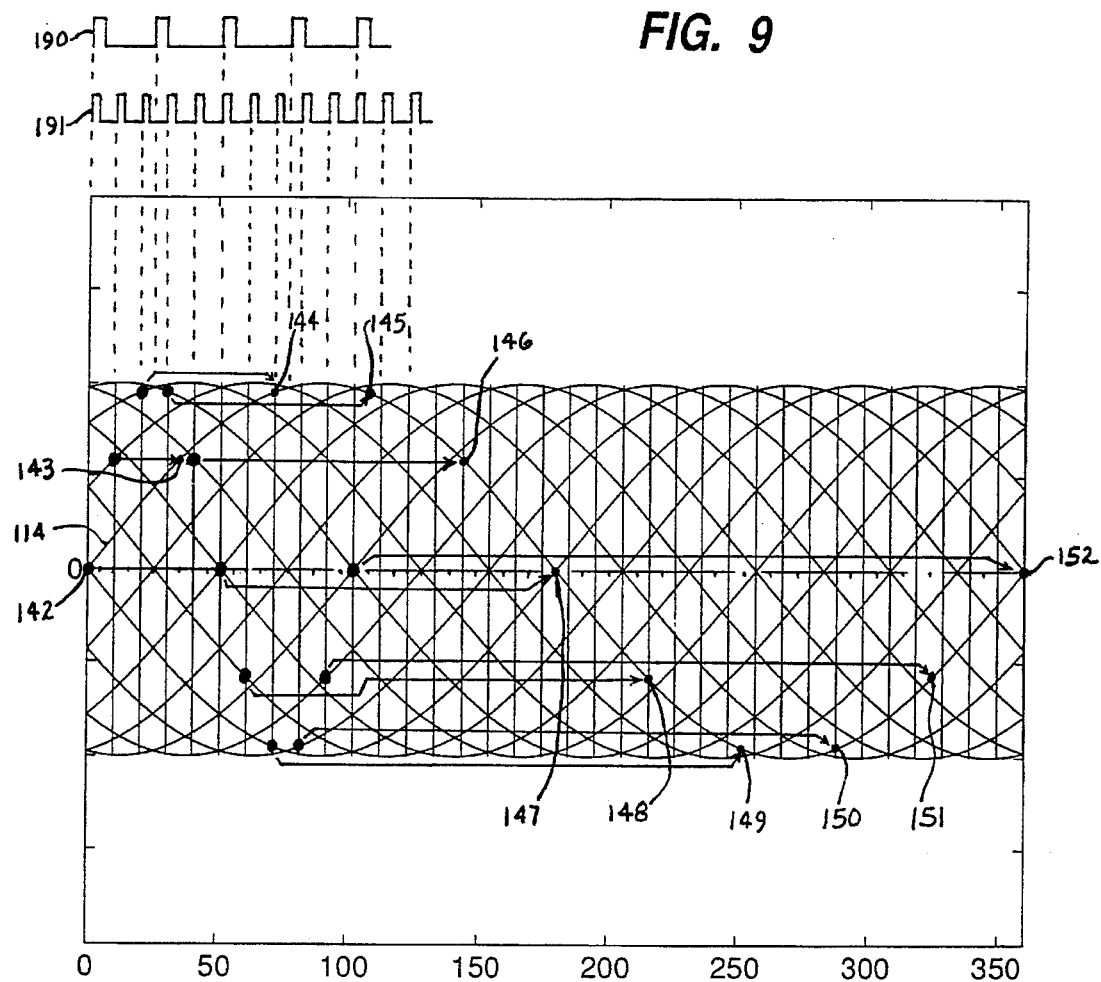
FIG. 9 graphically illustrates how to calculate the time intervals for sampling the source signal when the digital implementation is used as a spectral up scaling system.

Spectral up scaling can be carried out using the ADC 109, memory 110 and DAC 111 of FIG. 5. Here, the time intervals for sampling the source signal is carried out by using the ADC trigger signal 112 whose timings are calculated from the algorithm shown in Table 2. The variables used in Table 2 have same meaning as described above. The third obtain a continuous analog output. In FIG. 9, points 142, 143, 144, . . . , 152 on the spectrally up converted signal are projected on the source sine wave signal 114. Clearly, point 142 occurs at time 0, point 143 occurs at $(5+2)\mu$ seconds, point 144 occurs at $2(5+2)\mu$ seconds and so on. The resulting reconstructed signal defined by the points has a frequency that is greater than the source signal, and is thus spectrally up scaled.

Spectrally up scaling and down scaling is believed to be highly advantageous in video transmission systems where the video signals can be down scaled before transmission, transmitted with a short wave carrier through the ionosphere, and then received at the receiver and spectrally up scaled to retrieve the video image. Using this approach, intermediate satellite transmission is not required. In other applications where a high bandwidth filters are not feasible, the same signal can be down converted, filtered by available filters and then up scaled to continue the process. As can be appreciated, many other applications of the invention may be envisioned from the foregoing description.

While the preferred and other embodiments of the invention have been disclosed with reference to specific circuits and techniques, it is to be understood that many changes in detail may be made as a matter of engineering choices, without departing from the spirit and scope of the invention, as defined by the appended claims. For example, a high speed digital signal processor can be programmed to generate signals or otherwise control the sampling system and other aspects of the invention.

TABLE 2

| | | | | | |
|---|---|---|---|---|---|
| Points on the output signal | 142 | 143 | 144 | 145 | . . . | 152 |
| Time samples on the source signal for FIG. 9 | 0 | $(5 + 2)\mu$ | $2(5 + 2)\mu$ | $3(5 + 2)\mu$ | . . . | $13(5 + 2)\mu$ |
| Time samples on the source signal (general case) | 0 | $(m + n)\mu$ | $2(m + n)\mu$ | $3(m + n)\mu$ | . . . | $13(m + n)\mu$ | row of the Table 2 shows the time intervals at which the source signal has to be sampled using the ADC trigger signal 112. This sampled data is stored in the dual port memory 110, and data is simultaneously read out using the trigger appearing at the intervals similar to those chosen for controlling the switching FETs 28, 27, 26, . . . 15.

In FIG. 9, a method is graphically illustrated to precalculate the time interval for use with the digital implementation of the spectrum scaling for up conversion shown in FIG. 5. A simple sine wave 114 is considered as the source to illustrate the method. ADC 109 in FIG. 5 samples the source signal at preset intervals shown by the trigger signal 190 in FIG. 9. The data is stored in dual port memory 110 and is read out to a DAC 111, or an equivalent device, and convened to an analog signal at time intervals shown by the timing signal 191. In this approach the rate at which the data is stored in the memory 110 is slower than the rate at which it is read out to the DAC 111. Hence there will be a dead time involved in the analog output signal until the succeeding new data arrives from the ADC 109. While not shown, additional circuits can be used to remove the dead time to

What is claimed is:

1. A method of processing a signal for spectral scaling thereof, comprising the steps of:
   dynamically propagating a source signal down a line with a defined velocity;
   effectively moving a sampling device along the line at a velocity that is different from the propagation velocity of the source signal, thereby producing a Doppler effect;
   obtaining sample data from the line, said sample data having characteristics representative of the source signal, and coupling the sample data to an output, whereby spectral scaling of the source signal is achieved.

2. The method of claim 1, wherein the source signal is sampled at a first rate and the sample data is coupled to an output circuit at a higher rate than said first rate.

3. The method of claim 1, wherein the source signal is sampled at a first rate and the sample data is coupled to an output circuit at a lower rate than said first rate.

* * * * *